United States Patent
Xie et al.

(10) Patent No.: US 10,734,525 B2
(45) Date of Patent: Aug. 4, 2020

(54) GATE-ALL-AROUND TRANSISTOR WITH SPACER SUPPORT AND METHODS OF FORMING SAME

(71) Applicant: GLOBALFOUNDRIES INC., Grand Cayman (KY)

(72) Inventors: Ruilong Xie, Schenectady, NY (US); Julien Frougier, Albany, NY (US); Christopher M. Prindle, Poughkeepsie, NY (US); Nigel G. Cave, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 31 days.

(21) Appl. No.: 15/920,886

(22) Filed: Mar. 14, 2018

(65) Prior Publication Data
US 2019/0288117 A1 Sep. 19, 2019

(51) Int. Cl.
| H01L 29/786 | (2006.01) |
| H01L 29/06 | (2006.01) |
| H01L 29/66 | (2006.01) |
| H01L 29/423 | (2006.01) |

(52) U.S. Cl.
CPC .... *H01L 29/78603* (2013.01); *H01L 29/0673* (2013.01); *H01L 29/42392* (2013.01); *H01L 29/66439* (2013.01); *H01L 29/66545* (2013.01); *H01L 29/66742* (2013.01); *H01L 29/66772* (2013.01); *H01L 29/78654* (2013.01); *H01L 29/78696* (2013.01)

(58) Field of Classification Search
None
See application file for complete search history.

(56) References Cited

U.S. PATENT DOCUMENTS

| 2011/0254102 | A1 | 10/2011 | Xiao et al. |
| 2014/0217502 | A1* | 8/2014 | Chang ............... H01L 29/66477 257/347 |
| 2015/0372104 | A1* | 12/2015 | Liu ................... H01L 29/42364 257/77 |
| 2017/0162685 | A1* | 6/2017 | Kanakasabapathy ........................ H01L 29/785 |

* cited by examiner

*Primary Examiner* — Steven B Gauthier
(74) *Attorney, Agent, or Firm* — Anthony Canale; Hoffman Warnick LLC

(57) ABSTRACT

The disclosure relates to gate-all-around (GAA) transistors with a spacer support, and related methods. A GAA transistor according to embodiments of the disclosure includes: at least one semiconductor channel structure extending between a source terminal and a drain terminal; a spacer support having a first portion thereof positioned underneath and a second portion thereof positioned alongside a first portion of the at least one semiconductor channel structure; and a gate metal surrounding a second portion of the at least one semiconductor channel structure between the source and drain terminals; wherein the spacer support is positioned between the gate metal and the source or drain terminal.

14 Claims, 18 Drawing Sheets

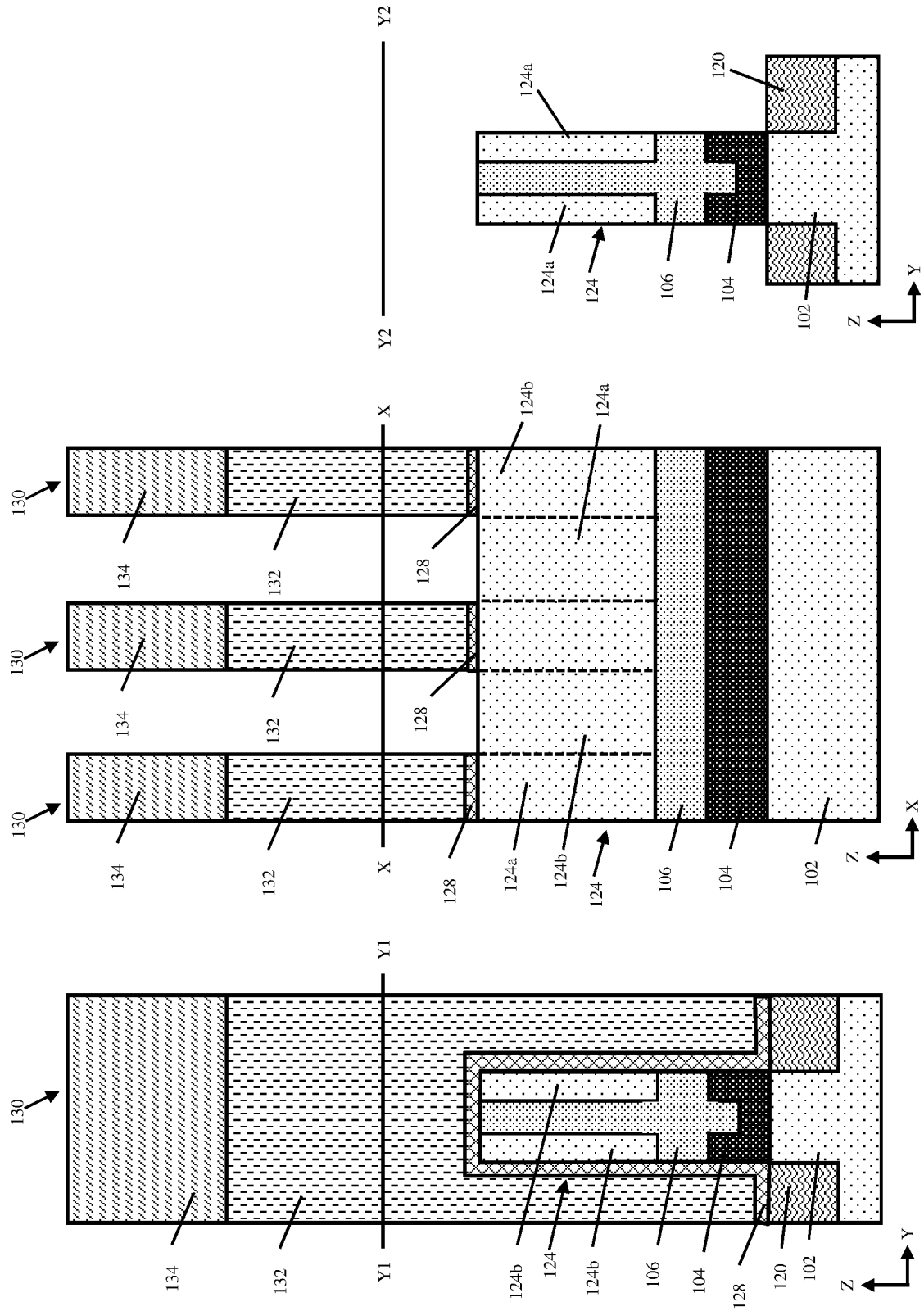

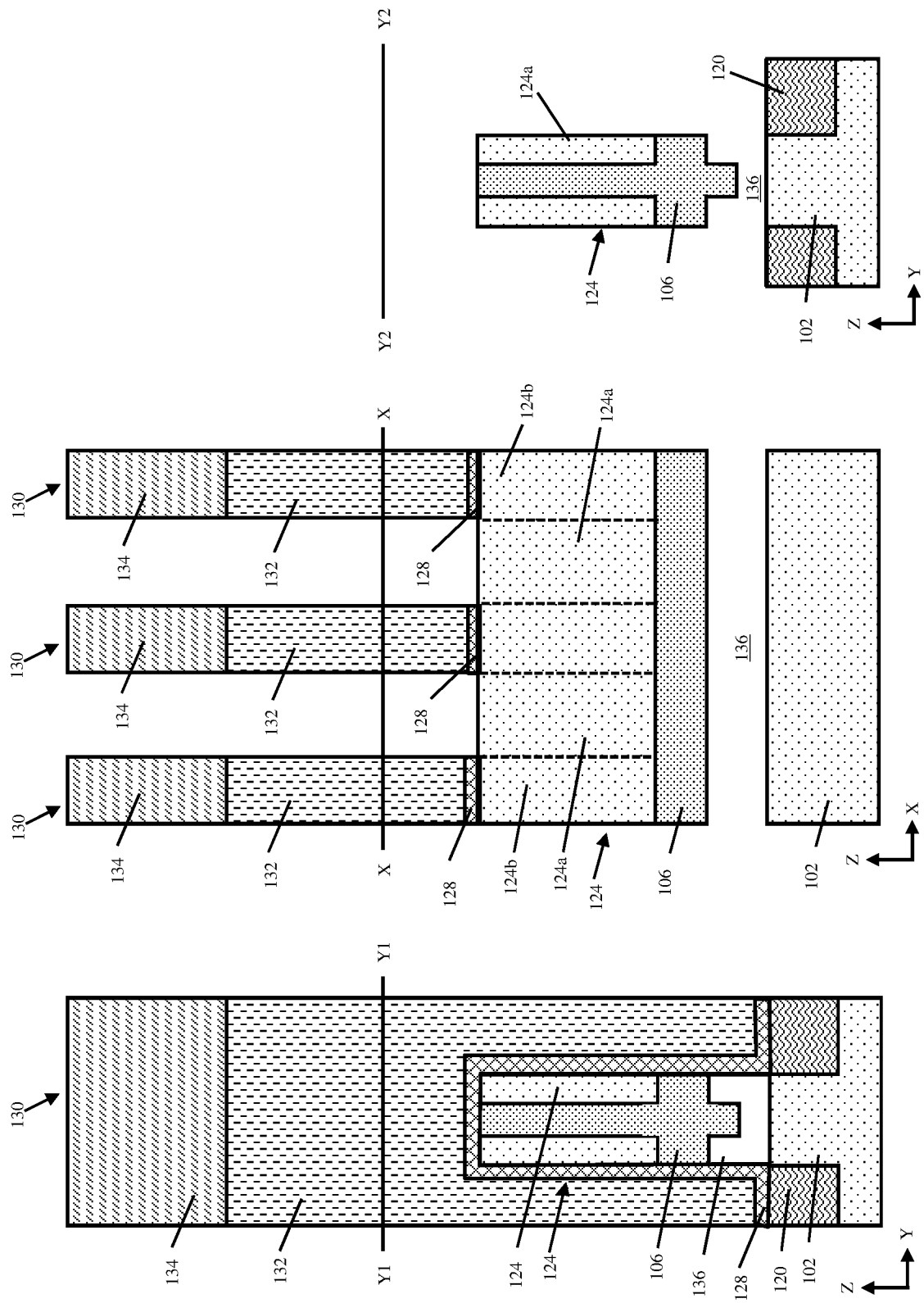

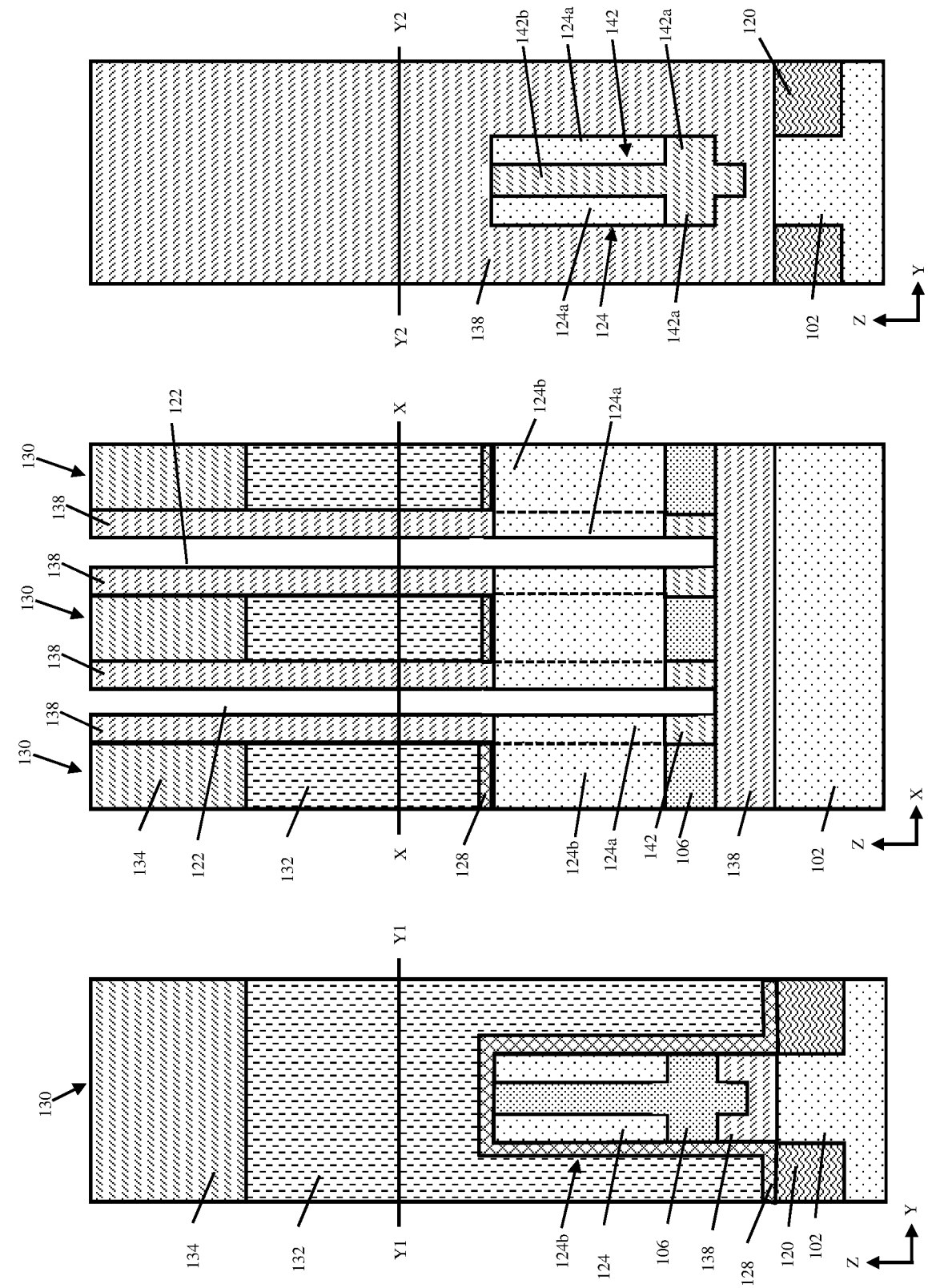

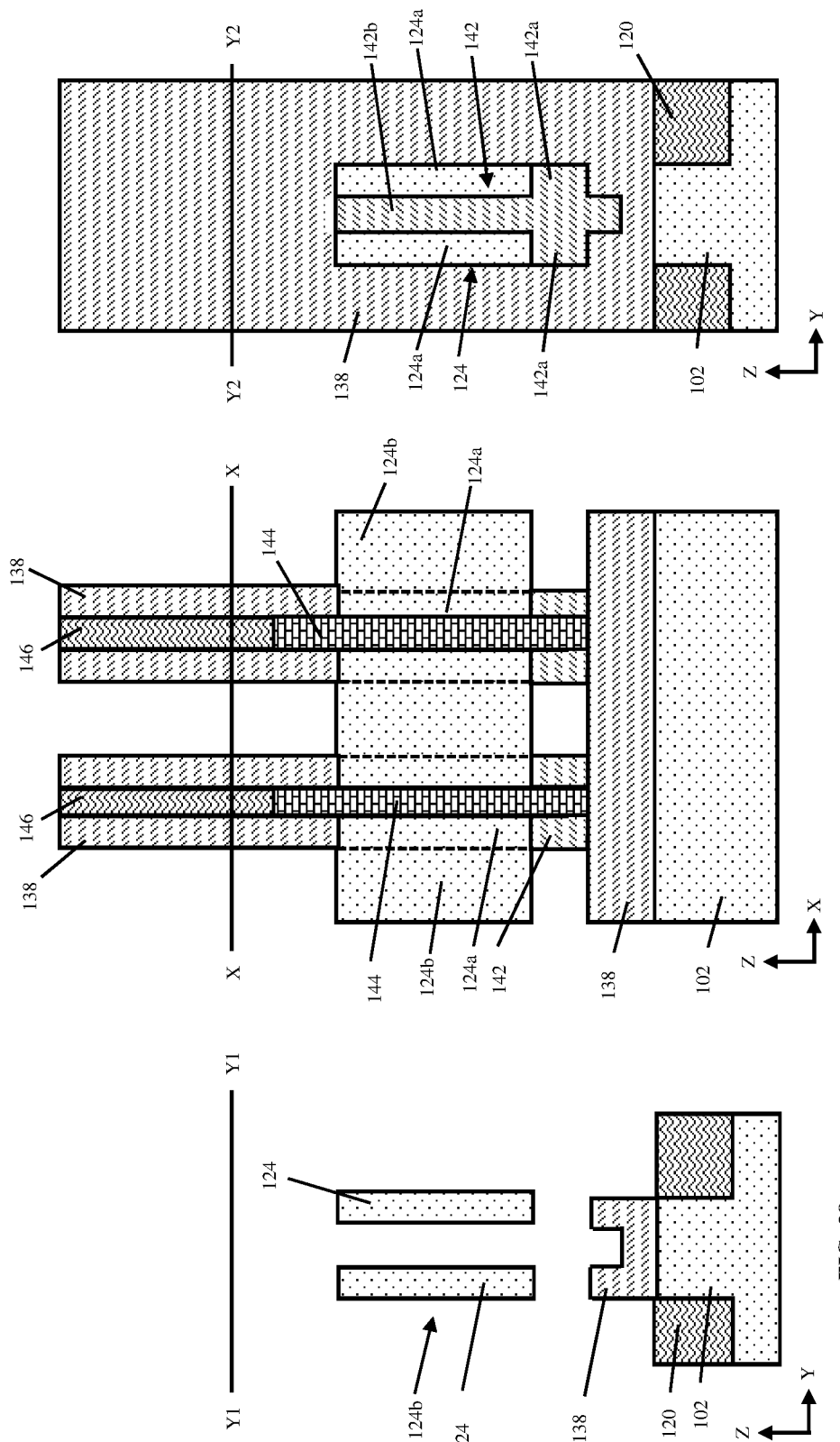

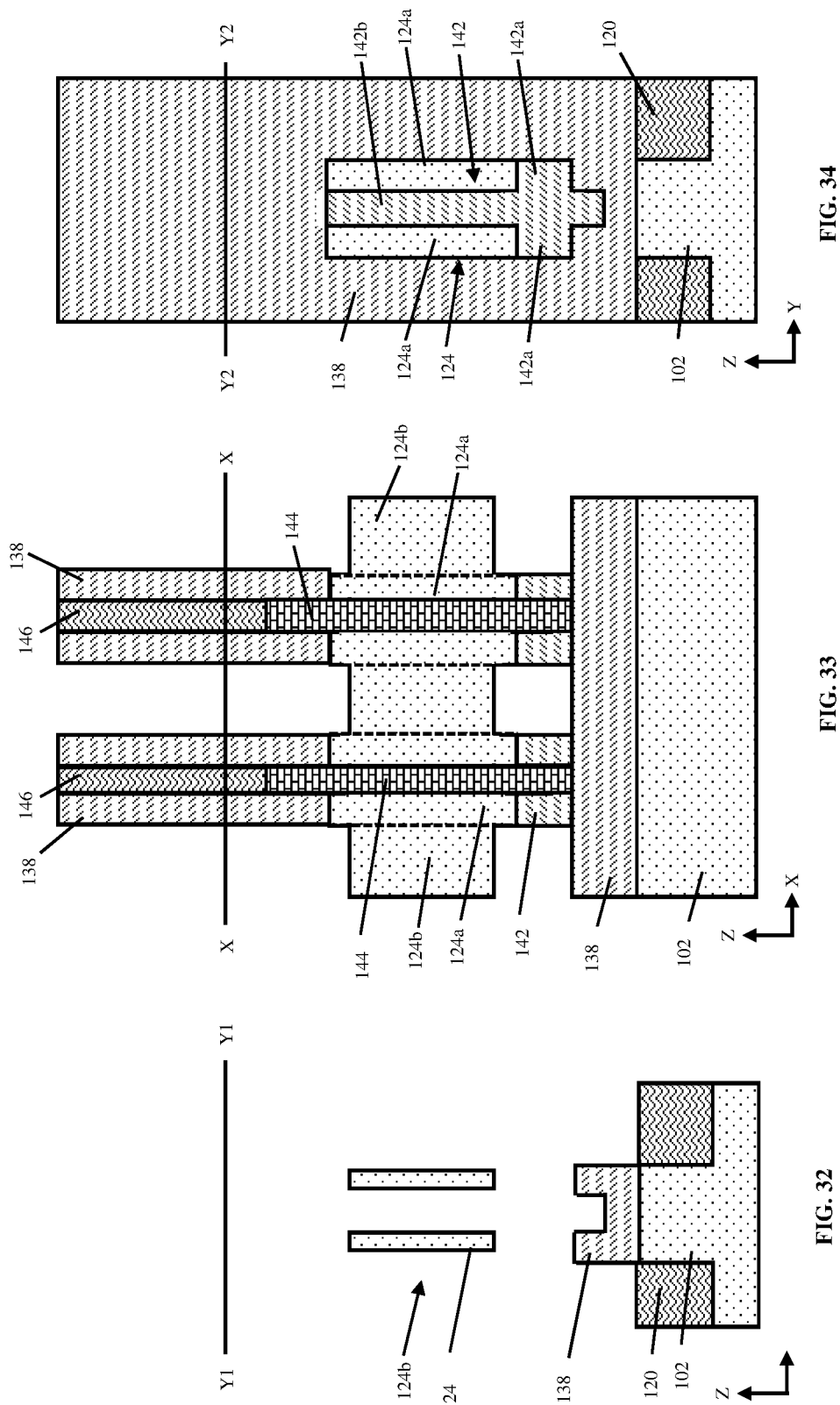

GATE-ALL-AROUND TRANSISTOR WITH SPACER SUPPORT AND METHODS OF FORMING SAME

BACKGROUND

Technical Field

The present disclosure relates to integrated circuit (IC) manufacture, and more particularly to gate-all-around (GAA) transistors with spacer supports for providing mechanical stability, and related methods.

Related Art

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") have become increasingly widespread because FinFETs offer better electrostatic control over the behavior in the channel than planar FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate. Continued development of transistor architectures has yielded dimensional improvements to FET technology, such as "gate all around" (GAA) device architectures.

GAA transistors provide a structure similar to a FinFET in which the gate metal wraps completely around a semiconductor channel material within a two dimensional space. GAA transistors may be preferable where significantly reduced gate lengths are required in a circuit design. GAA transistors may provide a higher amount of contact area between the gate metal and the semiconductor channel as compared to conventional devices. However, GAA transistors are more difficult to form than FinFET transistors and may have competing constraints. For example, a GAA transistor may have a substantially greater vertical height than horizontal width in order to provide a very small separation distance between device structures. The need to form a layer of sacrificial semiconductor material beneath the fin of a GAA transistor may further increase the height of the resulting transistor structure. These processing characteristics may cause GAA transistors have less mechanical stability than conventional FinFET transistors. A conventional GAA transistor thus may be prone to vertical bending, non-uniformity, or even collapse.

SUMMARY

A first aspect of the disclosure provides a gate-all-around (GAA) transistor including: at least one semiconductor channel structure extending between a source terminal and a drain terminal; a spacer support having a first portion thereof positioned underneath and a second portion thereof positioned alongside a first portion of the at least one semiconductor channel structure; and a gate metal surrounding a second portion of the at least one semiconductor channel structure between the source and drain terminals; wherein the spacer support is positioned between the gate metal and the source or drain terminal.

A second aspect of the disclosure provides a method, including: forming an opening to separate a semiconductor channel material into a pair of semiconductor channel structures, wherein the opening includes a first portion between the pair of semiconductor channel structures and a second portion beneath the pair of semiconductor channel structures; forming a spacer support within the opening, the spacer support having a first portion thereof positioned underneath and a second portion thereof positioned alongside a first portion of the pair of semiconductor channel structures; forming a source/drain terminal adjacent an end of the pair of semiconductor channel structures; and forming a gate metal surrounding a second portion of the pair of semiconductor channel structures adjacent to the first portion of the pair of semiconductor channel structures, wherein the spacer support is positioned between the source/drain terminal and the gate metal.

A third aspect of the disclosure provides a method, including: providing a precursor structure including: providing a precursor structure including: a sacrificial material positioned above a semiconductor substrate, and a semiconductor channel material positioned on the sacrificial material; forming an opening within the semiconductor channel material to separate the semiconductor channel material into a pair of semiconductor channel structures; forming an additional portion of the sacrificial material within the opening; forming a support region between and underneath a first portion of the pair of semiconductor channel structures by removing the sacrificial material and the additional portion of the sacrificial material; forming a spacer support within the support region, the spacer support having a first portion thereof positioned underneath and a second portion thereof positioned alongside the first portion of the pair of semiconductor channel structures; forming a source/drain terminal adjacent an end of the pair of semiconductor channel structures; and forming a gate metal surrounding a second portions of the pair of semiconductor channel structures adjacent to the first portions of the pair of semiconductor channel structures, wherein the spacer support is positioned between the source/drain terminal and the gate metal.

BRIEF DESCRIPTION OF THE DRAWINGS

The embodiments of this disclosure will be described in detail, with reference to the following figures, wherein like designations denote like elements, and wherein:

FIG. 8 shows a first cross-sectional view, in plane Y-Z along line Y1-Y1 of FIG. 7, of a first portion of a semiconductor channel structure and gate structure according to embodiments of the disclosure.

FIG. 9 a second cross-sectional view, in plane X-Z along line X-X of FIG. 7, of a semiconductor channel structure and gate structures according to embodiments of the disclosure.

FIG. 10 shows a third cross-sectional view, in plane Y-Z along line Y2-Y2 of FIG. 7, of a second portion of a semiconductor channel structure according to embodiments of the disclosure.

FIGS. 11-13 each show the three cross-sectional views of a step of removing sacrificial material before forming a spacer material according to embodiments of the disclosure.

FIGS. 20-22 each show the three cross-sectional views of a step of forming a spacer support according to embodiments of the disclosure.

FIGS. 29-31 each show the three cross-sectional views of a step of removing the gate structures according to embodiments of the disclosure.

FIGS. 32-34 each show the three cross-sectional views of a step of thinning the semiconductor channel structures according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit (IC) design, and more particularly to gate-all-around (GAA) transistors with spacer supports positioned underneath and alongside a semiconductor channel structure, and methods of forming the same. Specifically, embodiments of the disclosure include forming one or more regions of spacer material, referred to herein as support spacers, to structurally support semiconductor channel regions. The presence of support spacers in a GAA transistor may reduce the occurrence of bending, breaking, or non-uniform formation of semiconductor channel structures in the GAA transistor. The support spacers may be formed horizontally between a gate metal surrounding the semiconductor channel structure(s), and a source or drain terminal at one end of the channel. The various embodiments herein may be provided and/or implemented without being limited to one transistor architectures, e.g., fin-type and/or nanosheet-type transistors, vertical and/or horizontal transistors, etc.

It will also be understood that when an element such as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Methods as described herein may be used in the fabrication of IC chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

Figure 1:
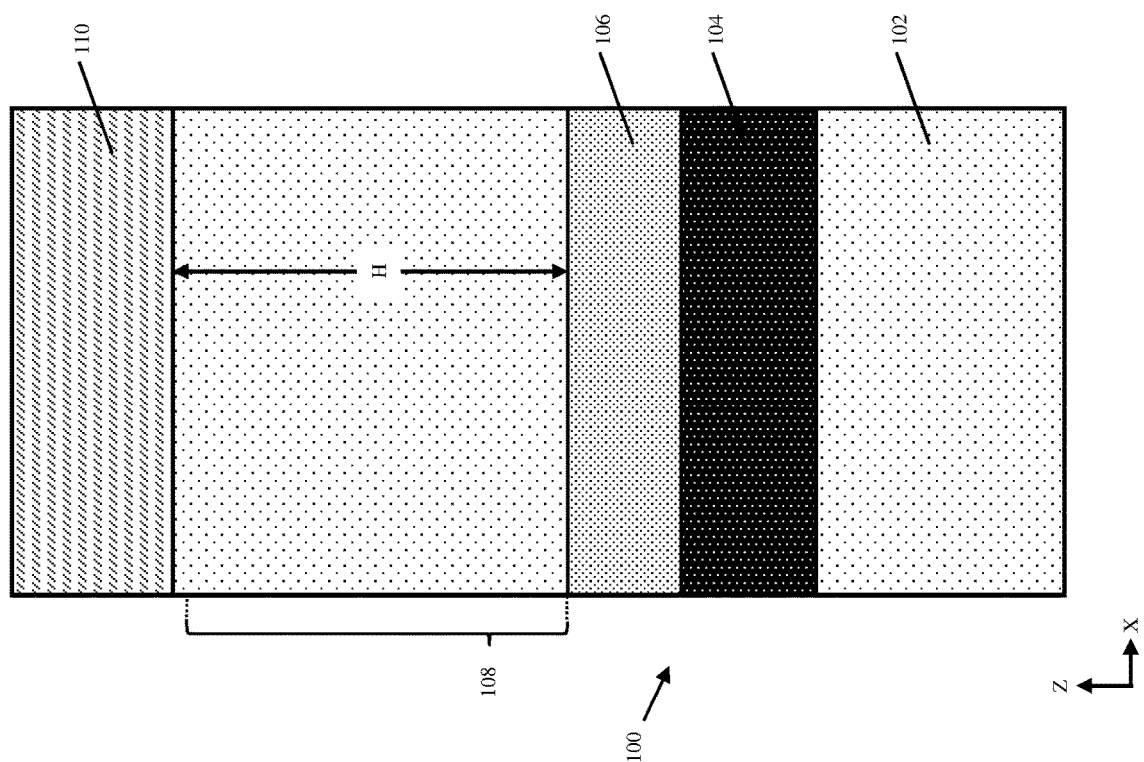
FIG. 1 shows a cross-sectional view, in plane X-Z, of a substrate and initial structure before being processed according to embodiments of the disclosure.

Referring to FIG. 1, a cross-sectional view in plane X-Z of an initial structure 100 to be processed according to embodiments of the disclosure is shown. Initial structure 100 may be processed to form a gate-all-around (GAA) transistor according to embodiments of the disclosure. Thus, initial structure 100 may represent a portion of a larger IC structure for fabrication into one or more GAA transistors, as described herein.

Initial structure 100 may include a substrate 102. As shown, substrate 102 may include any currently-known or later developed material capable of being processed into a transistor structure, and may include, e.g., a bulk semiconductor layer, a semiconductor-on-insulator (SOI) substrate, etc., which may include one or more sites targeted for transistor formation as described herein. Substrate 102 thus may overlie one or more other layers of material having distinct material and/or electrical properties, with such layers of material being omitted from the accompanying FIGS. to better illustrate structures and processes to form an IC structure according to embodiments of the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained.

Substrate 102 may have a variety of configurations, such as the depicted bulk silicon configuration. Substrate 102 may also have a silicon-on-insulator (SOI) configuration that includes a bulk silicon layer, a buried insulation layer and an active layer, wherein semiconductor devices are formed in and above the active layer. As noted previously, substrate 102 may be made of silicon or it may be made of materials other than silicon. Thus, the terms "substrate" or "semiconductor substrate" should be understood to cover all semiconducting materials and all forms of such materials. Substrate 102 of initial structure 100 may be formed by forming a semiconductor material on an underlying structure (not shown). For the purposes of example and simplicity, other materials and/or layers positioned beneath substrate 102 have been omitted from the accompanying figures. In addition, the various cross-sectional views in FIGS. 1-6 are shown to be in a "cross-gate direction." Substrate 102 may be processed to include trenches, insulating materials, etc., for electrically isolating distinct transistor structures formed from the same substrate 102. Examples of such isolation materials are discussed below, e.g., by reference to FIG. 2.

According to an example, substrate 102 may be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Advantages of the disclosure may include reduced bending, structural non-uniformity, and/or collapse of tall semiconductor fins. These features may stem from the forming and presence of spacer supports beneath and between various pairs of semiconductor channel materials. The location, size, shape, etc., of spacer supports in the transistor structure may result from the forming of sacrificial materials before subsequent forming of various transistor elements (e.g., source or drain terminals, gate metals, channel regions, etc.). Various sacrificial materials initially positioned on substrate 102 may determine the shape of spacer supports formed in later manufacturing steps. A layer of a first sacrificial material 104 may be positioned on substrate 102, and formed by way of deposition, epitaxial growth, and/or any other currently known or later developed procedure of forming a semiconductor material on another semiconductor material. For targeted removal or modification of first sacrificial material 104 with respect to substrate 102 and other semiconductor materials, first sacrificial material 104 may have a different material composition from substrate 102. According to an example, first sacrificial material 104 may include silicon germanium (SiGe) with a predetermined concentration of silicon and germanium therein. As discussed elsewhere herein, first sacrificial material 104 may exhibit a higher germanium concentration relative to other sacrificial materials formed thereon. It is therefore understood that first sacrificial material 104 may generally include a majority-germanium region of SiGe. It is possible in alternative implementations for first sacrificial material 104 to include a majority-silicon region of SiGe, or other semiconductor material. According to one example, first sacrificial material 104 may have a germanium concentration of between approximately forty and approximately eighty percent. According to another example, first sacrificial material 104 may have a germanium concentration of approximately sixty percent.

Initial structure 100 may additionally include a layer of a second sacrificial material 106 positioned on first sacrificial material 104. Second sacrificial material 106 may also have a different material composition from that of substrate 102 and/or first sacrificial material 104. The material composition of second sacrificial material 106 being different from first sacrificial material 104 may allow second sacrificial material 106 to be processed (e.g., targeted for etching) independently from first sacrificial material 104. According to an example, second sacrificial material 106 may include SiGe with a germanium concentration less than that of first sacrificial material 104. The composition of second sacrificial material 106 may be selected based on the germanium concentration of first sacrificial material 104, and may exhibit a majority-silicon or majority-germanium composition. Second sacrificial material 106 may have a germanium concentration of at most, e.g., approximately twenty percent or at most approximately sixty-percent, depending on the characteristics of first sacrificial material 104. In an alternative embodiment, second sacrificial material 106 may have a germanium concentration of approximately thirty-five percent. In still further examples, second sacrificial material 106 may take the form of a semiconductor material capable of being etched selectively with respect to substrate 102 and/or first sacrificial material 104.

Initial structure 100 may include a layer of a semiconductor channel material 108 formed on second sacrificial material 106. Semiconductor channel material 108 may have a vertical height above second sacrificial material 106 suitable to form multiple channel structures for a gate-all-around (GAA) transistor. For instance, semiconductor channel material 108 may be formed to a height H of approximately seventy nanometers (nm), or between thirty and two hundred nm, above second sacrificial material 106. Semiconductor channel material 108 may take the form of a single layer of semiconductor material until portions thereof are processed, removed, etc., to form source or drain terminals for a GAA transistor as discussed elsewhere herein. Initial structure may also include, e.g., an insulator 110 on semiconductor channel material 108. The composition of insulator 110 may include any currently known or later developed insulative material, e.g., one or more currently known or later developed nitride insulators such as, e.g., silicon nitride (SiN). Insulator 110 may be formed on initial structure 100, e.g., to protect portions of semiconductor channel material 108 thereunder from being targeted and/or modified during a subsequent etching of initial structure 100 as discussed below.

Figure 2:
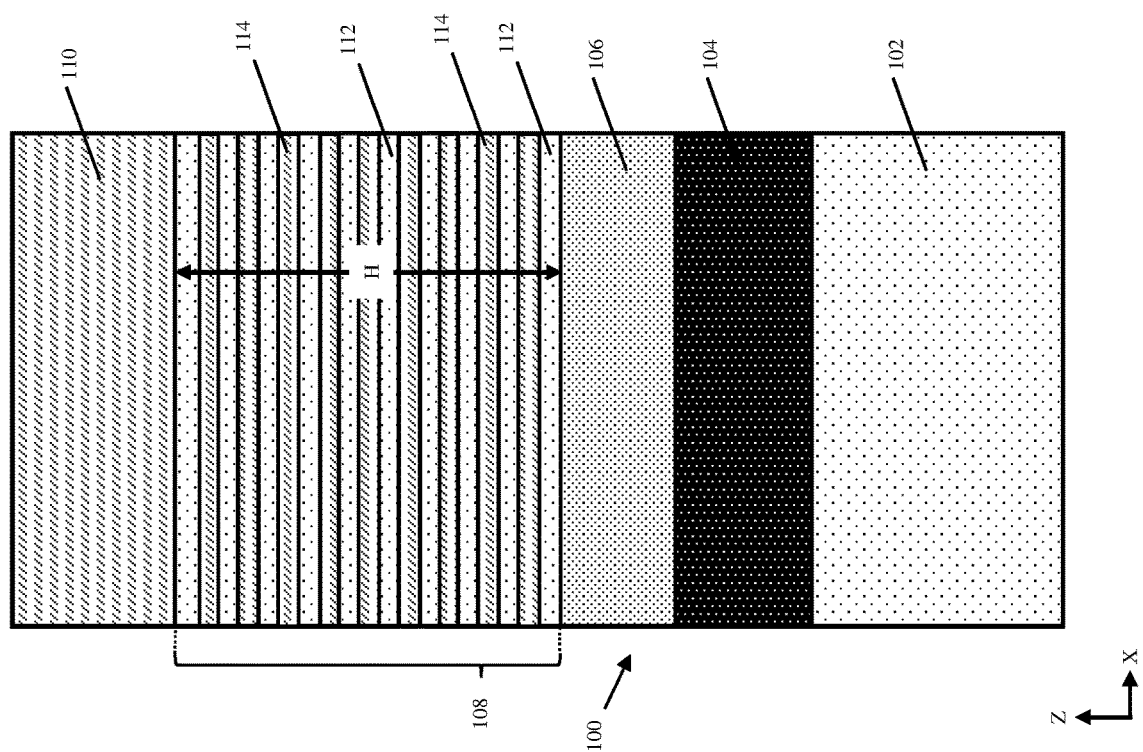
FIG. 2 shows a cross-sectional view, in plane X-Z, of the substrate and an alternative initial structure with semiconductor nanosheets before being processed.

As shown in FIG. 2, semiconductor channel material 108 in some cases may take the form of a set of semiconductor nanosheets 112 formed alternatingly with a set of sacrificial layers 114. Semiconductor nanosheets 112 and sacrificial layers 114 may initially be formed as alternating layers of material above substrate 102 and sacrificial materials 104, 106. Semiconductor nanosheets 112 may be formed from any currently known or later developed semiconductor material, e.g., silicon, with the various example compositions of substrate 102 being operable for use in semiconductor nanosheets 112. Sacrificial layers 114, by contrast, can be composed of a different material relative to the composition of semiconductor nanosheets 112, e.g., one or more materials selected to facilitate replacement with different materials (e.g., conductive and/or insulator materials) in subsequent processing. According to an example embodiment, sacrificial layer(s) 114 may include silicon germanium (SiGe). In this case, sacrificial layer(s) 114 may be replaced with one or more conductive materials in subsequent processing according to any currently known or later developed technique for providing a conductive nanosheet between semiconductor nanosheets 112. For example, sacrificial layers 114 may be removed by longitudinally etching and removing the components of each sacrificial layer 114 and filling/replacing the semiconductor material with a conductive metal.

In any case, each nanosheet 112 and layer 114 may be structurally distinct from other elements described herein by having a significantly reduced thickness as compared to other transistor elements. In an example, each individual nanosheet 112 may have a vertical thickness of, e.g., approximately five nm, or between approximately three nm and approximately eight nm. Each sacrificial layer 114 may have a vertical thickness of, e.g., 11 nm, or between 6 nm to 15 nm. Continued processing according to embodiments of the disclosure is shown with semiconductor channel material 108 in the form of a fin-type semiconductor material (e.g., as shown in FIG. 1), but it is understood that the various processes described herein may be applicable to the manufacture of semiconductor channel materials 108 which include nanosheets 112 and sacrificial layers 114.

Figure 3:
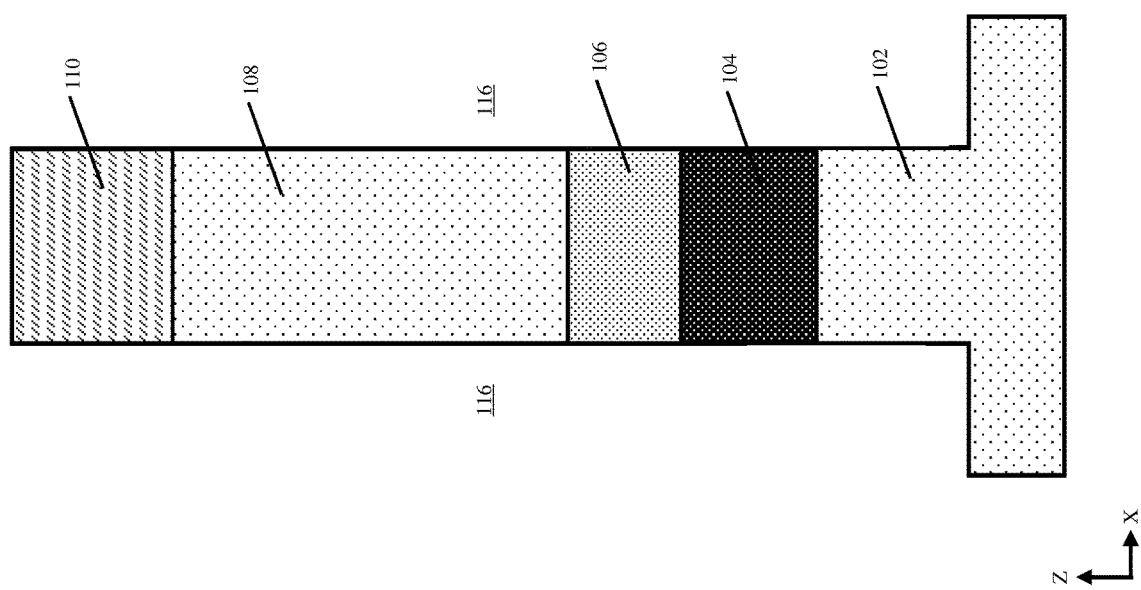
FIG. 3 shows a cross-sectional view, in plane X-Z, of the substrate and semiconductor channel material being etched according to embodiments of the disclosure.

FIG. 3 illustrates a step for patterning initial structure 100 to prepare for the eventual formation of insulating materials between different regions of substrate 102 and device structures formed thereon. A set of insulator cavities 116 may be etched into substrate 102 on opposite sides of initial structure 100 to create regions of horizontal isolation between different transistors. The forming of insulator cavities 116 (e.g., by etching) removes targeted portions of insulator 110, semiconductor channel material 108, and sacrificial materials 104, 106 before removing portions of substrate 102 thereunder. Insulator cavities 116 may be formed by etching, e.g., with a mask in place on a portion of insulator 110. Etching generally refers to the removal of material (e.g., various structures formed above substrate 102), and is often performed with a mask in place so that material may selectively be removed from certain areas of the substrate, while leaving the material unaffected in other areas of the substrate. An example of an etching process may include "dry etching." A dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases that approach the wafer approximately from one direction, and therefore this process is highly anisotopic. After insulator cavities 116 have been formed, the remaining portions of substrate 102, first sacrificial material 104, second sacrificial material 106, semiconductor channel material(s) 108, and insulators 110 may each have a horizontal width of, e.g., approximately thirty nm or between approximately twenty nm and approximately forty nm.

Figure 4:
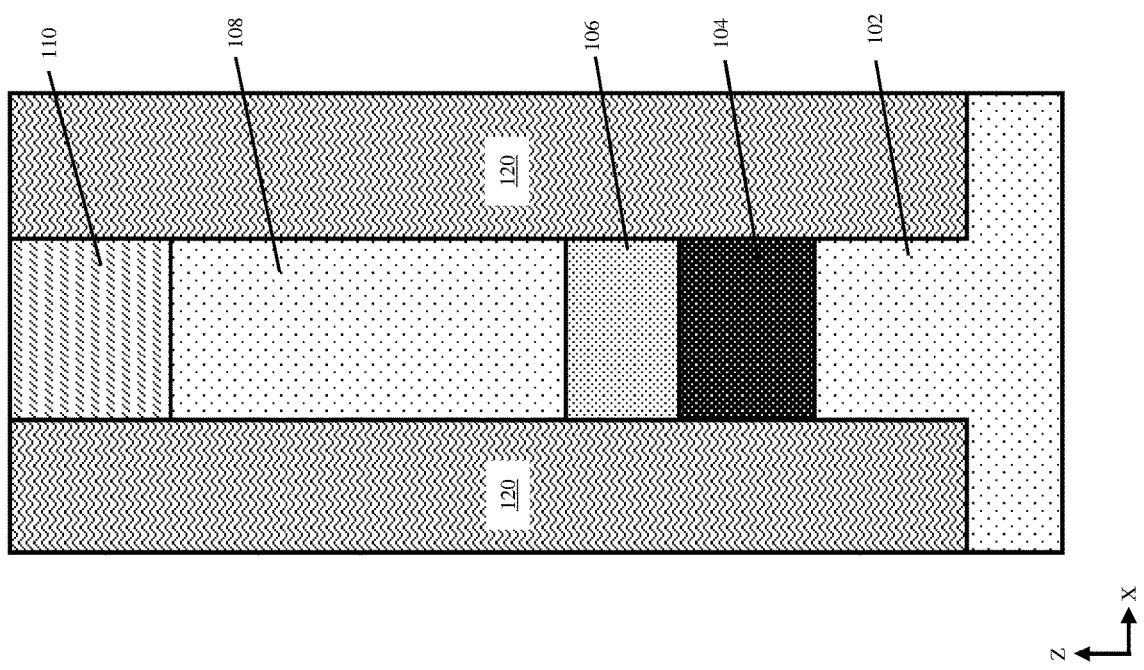
FIG. 4 shows a cross-sectional view, in plane X-Z, of forming a shallow trench isolation (STI) according to embodiments of the disclosure.

Turning now to FIG. 4, continued manufacturing of the structure may include forming one or more shallow trench isolations (STI) 120 within insulator cavities 116 (FIG. 3) and adjacent to the non-etched materials on substrate 102. STI 120 may be formed to provide structural and electrical separation between semiconductor channel material(s) 108 and device components formed thereon. STI 120 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. STI 120 may be etched to approximately the height of substrate 102 above underlying materials (not shown). STI 120 may be formed by CVD or ALD dielectric deposition followed by chemical mechanical planarization (CMP).

Figure 5:
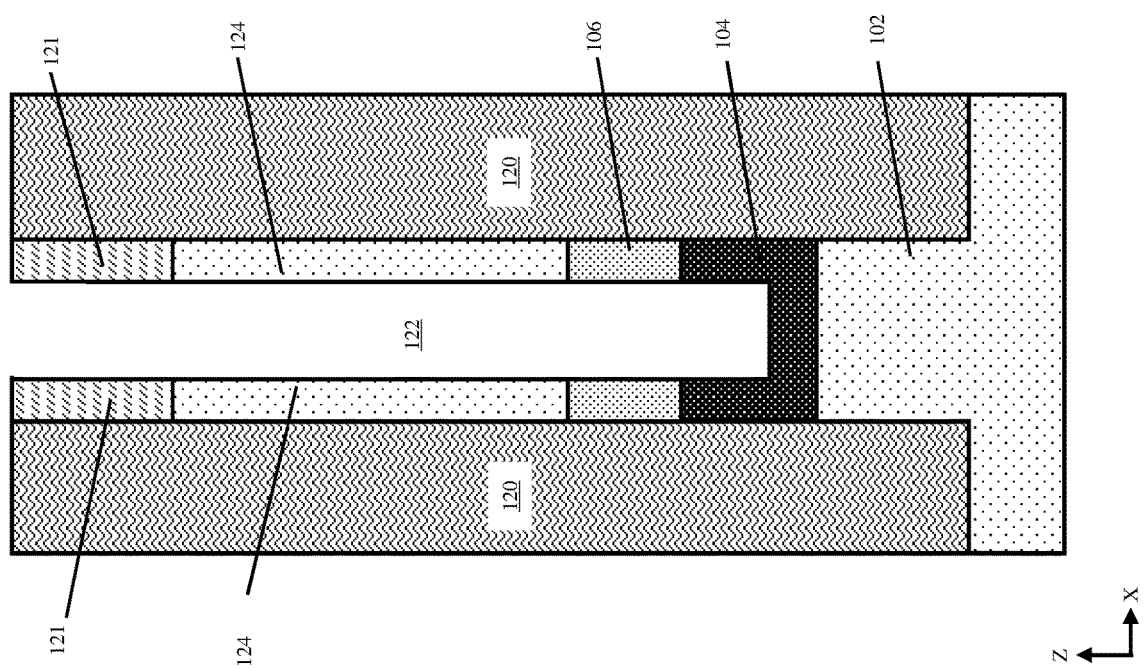
FIG. 5 shows a cross-sectional view, in plane X-Z, of separating the semiconductor channel material into a pair of semiconductor channel structures according to embodiments of the disclosure.

Referring to FIGS. 4 and 5, continued manufacturing of IC structures according to embodiments of the disclosure may include separating semiconductor channel material 108 into two separate structures. The separating of semiconductor channel material 108 may be implemented by removing portions of sacrificial material 104, 106, semiconductor channel material 108, and insulator 110. Specifically, forming a GAA transistor according to embodiments of the disclosure may include removing insulator 110 (e.g., by selective etch) to uncover the upper surface of semiconductor channel material 108 and interior sidewalls of STI 120. Next, a conformal liner (not shown) of insulative material may be deposited on the uppermost surface of semiconductor channel material 108 and the sidewalls of STI 120. The conformal liner may then be anisotropically etched to form a pair of spacers 121, each of which may be positioned alongside STI 120 and above a portion of semiconductor channel material 108. The combined deposition and anisotropic etch may leave horizontal space between spacers 121. Next, portions of semiconductor channel material 108 horizontally between spacers 121 may be vertically etched. The same etching process may also remove an underlying region of second sacrificial semiconductor material 106. Continuing the etching may subsequently remove a region of first sacrificial semiconductor material 104 vertically underneath the previously removed region of each materials 106, 108. The etching may create an opening 122 which extends vertically through each layer of etched material. Remaining portions of sacrificial materials 104, 106, semiconductor channel material 108, and insulator 110 may remain positioned along the sidewalls of opening 122.

The etching of opening 122 may be performed using reactive ion etching (RIE) and/or other forms of non-selective or selective etching. The etching may separate semiconductor channel material 108 into a pair of semiconductor channel structures (simply "channel structures" hereafter) 124 with opening 122 located between them. Opening 122 may have a horizontal width of, e.g., approximately twelve nm, or within the range of from approximately eight nm to approximately fifteen nm. After the etching concludes, the resulting channel structures 124 may retain the original height of semiconductor channel material 108 above second sacrificial material 106. However, the etching to form opening 122 may reduce the horizontal width of each channel structure 124 to approximately nine nm, or a width within the range of approximately five nm to approximately twelve nm.

Figure 6:
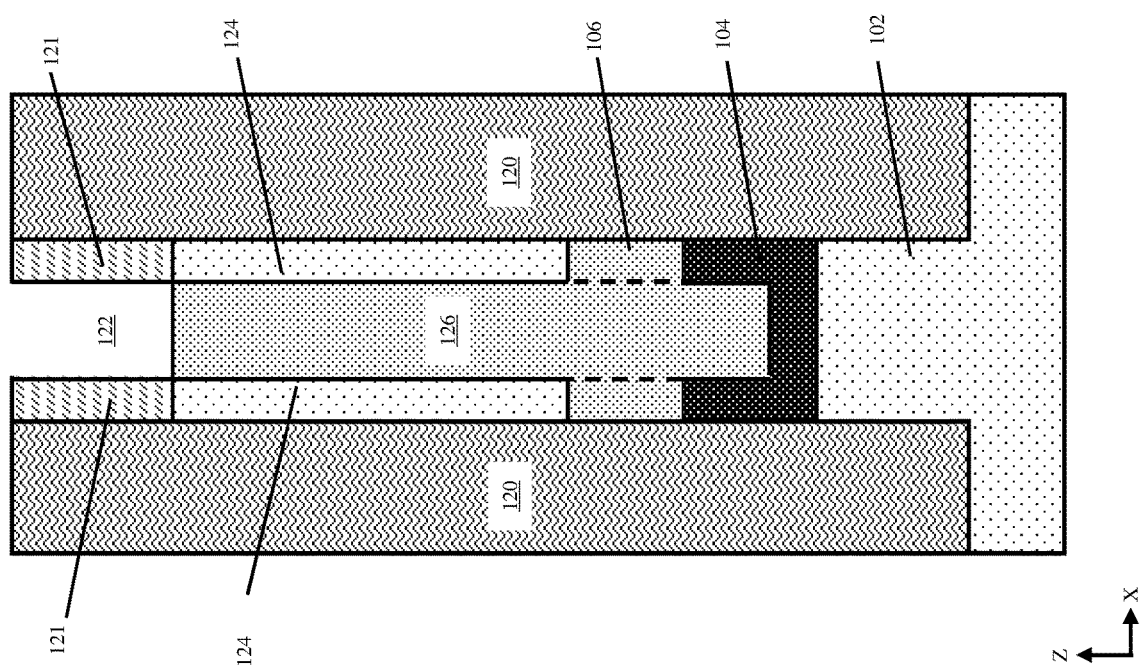
FIG. 6 shows a cross-sectional view, in plane X-Z, of forming an additional sacrificial material between semiconductor channel structures according to embodiments of the disclosure.

Second sacrificial material 106 may be used as a placeholder material in the forming of spacer supports for channel structures 124. Embodiments of the disclosure include spacer supports having a first portion underneath, and a second portion alongside, channel structures 124 to prevent deformation or non-uniformity during the manufacture of a GAA transistor. As shown in FIG. 6, to form the shape of the eventual spacer supports, an additional portion of second sacrificial material (simply "additional portion" hereafter) 126 may be formed within opening 122. Additional portion 126 may be formed by selective epitaxial growing of additional sacrificial material (e.g., SiGe with a lower germanium concentration than first sacrificial material 104) using second sacrificial material 106 as a seed layer. "Epitaxy" or "epitaxial growth," as used herein, refers to a process by which a thin layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces. Additional portion 126 may also be formed by depositing SiGe (e.g., with CVD) and then etching additional portion 126 back to a desired height above first sacrificial material 104. After being formed, additional portion 126 may be structurally indistinguishable from the original second sacrificial material 106. Additional portion 126 may be subsequently recessed (e.g., by etching) to substantially the same depth as insulator(s) 110 above channel structures 124. Together, second sacrificial material 106 and additional portion 126 may have a cross-sectional profile of two intersecting vertical and horizontal rectangles beneath and alongside channel structures 124, as shown in FIG. 6.

Figure 7:
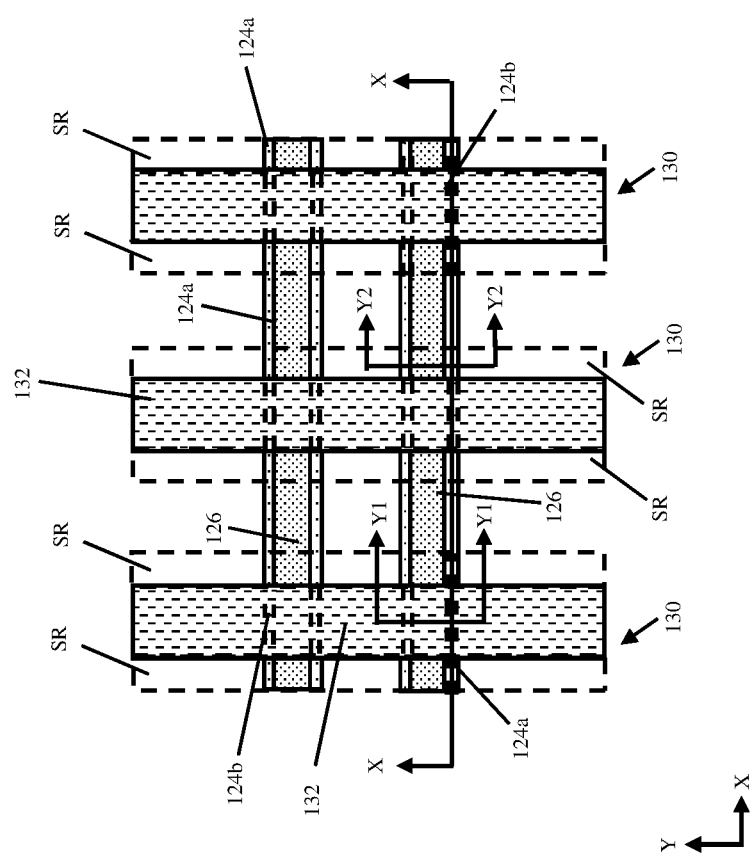
FIG. 7 shows a plan view, in plane X-Y, of forming gate structures according to embodiments of the disclosure.

Referring to FIGS. 7-10 together, portions of channel structures 124 may be targeted for the later forming of source or drain terminals or under the gate metals. FIG. 7 shows a plan view in plane X-Y of multiple transistor structures to be processed in embodiments of the disclosure. FIG. 8 provides a cross-section of one such structure along line Y1-Y1 in plane Y-Z. FIG. 9 provides a different cross-section of the structure along line X-X in plane X-Z. FIG. 10 provides yet another cross-section of the structure along line Y2-Y2 in plane Y-Z. As compared to the previously-discussed FIGS. 1-7, FIG. 7 and the cross-sections shown in FIGS. 8-40 depict a manufacturing embodiment to be implemented on multiple channel structures 124. The disclosure may include forming one or more placeholder materials on portions of each channel structure 124 where gate metals are desired. According to an example, each channel structure 124 may include a first portion 124a where gate metals are not desired and a second portion 124b where gate metal is desired.

As shown specifically in FIGS. 8 and 10, STI 120 may be recessed (e.g., by etching) to approximately the same height as substrate 102 to allow sacrificial gate materials to be formed on first portion 124b (FIGS. 8, 9) of channel structure(s) 124. An encapsulation liner 128 may be conformally deposited on exposed surfaces of sacrificial materials 104, 106, and channel structures 124. Encapsulation liner 128 may be composed of any currently known or later developed insulative material, e.g., an oxide, nitride, and/or other insulating material. Materials appropriate for the composition of encapsulation liner 128 may include, for example, silicon dioxide ($SiO_2$), silicon nitride (SiN), (SiCO), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide (ErOx), other silicon and nitride-based materials (e.g., SiBCN, SiNC, SiNOC), organosilicon compounds, and other currently known or later-developed materials having similar properties.

After encapsulation liner 128 is formed to protect the various materials thereunder, the method may proceed to forming dummy gate structures 130, alternatively known as "dummy gates," on portions of channel structure(s) 124 where gate metals will eventually be formed. Each dummy gate structure 130 can initially be formed on targeted regions of bulk nanosheet material to define the length of a later-formed metal, and to provide sacrificial material for yielding the targeted transistor structure in subsequent processing. In one embodiment, each dummy gate structure 130 may include a gate semiconductor 132 composed of, e.g., amorphous silicon (a-Si). An upper mask (also known as a hard mask) 134 composed of one or more layers of insulative or masking materials is positioned over gate semiconductor 132 to protect channel structures 124 and/or other underlying materials during subsequent processing. Portions of each channel structure 124 covered by dummy gate structure 130 are shown in phantom in the accompanying FIG. 7. Upper mask 134 may include, e.g., an insulator composed of a nitride or oxide material positioned beneath one or more layers of masking material, e.g., a silicon nitride or silicon oxide hard mask (indicated with different cross hatching).

Dummy gate structures 130 and encapsulation liner(s) 128 thereunder may initially be formed as single layers of material, before being processed into different regions. The separation of initial dummy gate material into individual dummy gate structures 130 may be implemented with the aid of a hard mask (not shown). In this case, a hard mask may be formed as a single layer, and then patterned to define the eventual position of each dummy gate structure 130. The patterning of the hard mask may be accomplished by any currently known or later developed process of transferring a pattern from a mask or reticle to a photoresist layer deposited on a structure. Lithography processes may include, e.g., self-aligned double patterning (SADP), self-aligned quadruple patterning (SAQP), extreme ultraviolet (EUV) patterning, and/or other single or multiple patterning techniques. The patterning may be followed by ashing to separate the single layer of hard mask into a plurality of smaller structures, such that materials not covered by the mask may be etched, e.g., to form dummy gate structures 130.

With continued reference to FIGS. 7-10 together, first portion(s) 124a of each channel structures 124 are not covered by portions of dummy gate structure(s) 130, as compared to second portions 124*b* located beneath dummy gate structure(s) 130. Portions 124*a*, 124*b* may be distinguished from each other solely based on the presence or absence of dummy gate structure(s) 130 thereon. Portions 124*a*, 124*b* of channel structures 124 may be processed separately in subsequent manufacturing steps according to embodiments of the disclosure, e.g., to form spacer supports and source or drain terminals at first portions 124*a* and to form gate materials around second portions 124*b*. The eventual location of spacers are shown as spacer regions SR in FIG. 7, with each spacer region being identified by a surface area alongside dummy gate structures 130. The cross-section along line Y2-Y2 in FIG. 10 and subsequent figures therefore illustrates on spacer region SR. Sacrificial materials 104, 106 may be exposed to etching at their sidewalls beneath first portion(s) 124*a* of channel structures 124, and thus may be removable by selective etch in subsequent processing steps. The present disclosure continues to discuss forming embodiments of a GAA transistor by reference to the same three cross-sectional views depicted in FIGS. 8-10.

Figure 14:
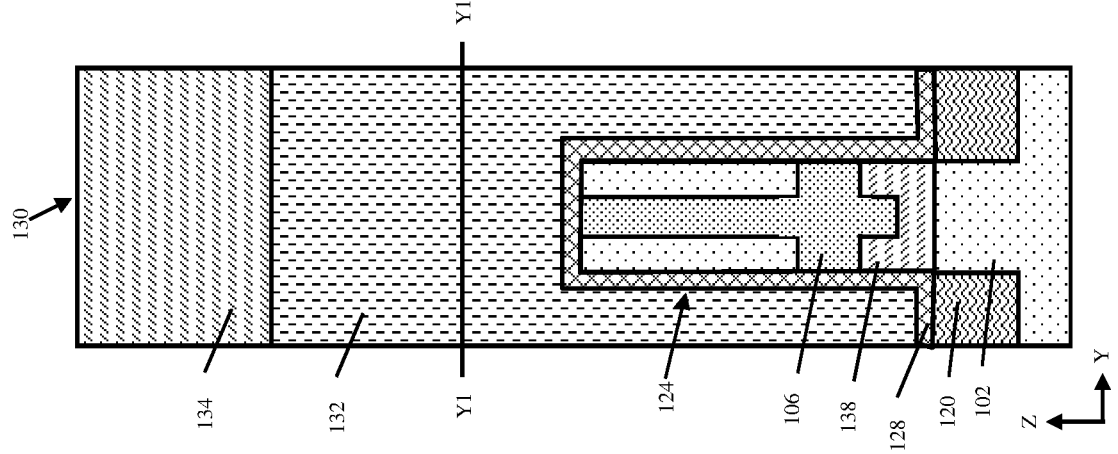

Continued discussion of methods and structures according to embodiments of the disclosure is made by reference to the three cross-sectional views shown in FIGS. 8-10. For example, FIG. 11 shows the first cross-sectional view in plane Y-Z of FIG. 8, FIG. 12 shows the second cross-sectional view in plane X-Z of FIG. 9, and FIG. 14 shows the third cross-sectional view in plane Y-Z of FIG. 10. Continued manufacturing may include removing first sacrificial material 104 (FIGS. 1-6 and 8-10) to form a spacer opening 136. Removing sacrificial material 104 to form spacer opening 136 may allow one or more spacer materials to be formed in the same location without affecting other materials, e.g., second sacrificial material 106, channel structures 124, dummy gate structures 130, etc. Etchants selective to the composition of first sacrificial material 104 (e.g., majority-germanium semiconductor materials or other semiconductor materials discussed herein) may be particularly effective for removing first sacrificial material 104 while leaving other materials intact. Various forms of selective etching may include, e.g., wet etching. Wet etching is generally performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. The previously formed dummy gate structure(s) 130 may continue to support the remaining second sacrificial material 106 and channel structures 124 after spacer opening 136 is created.

Figure 16:
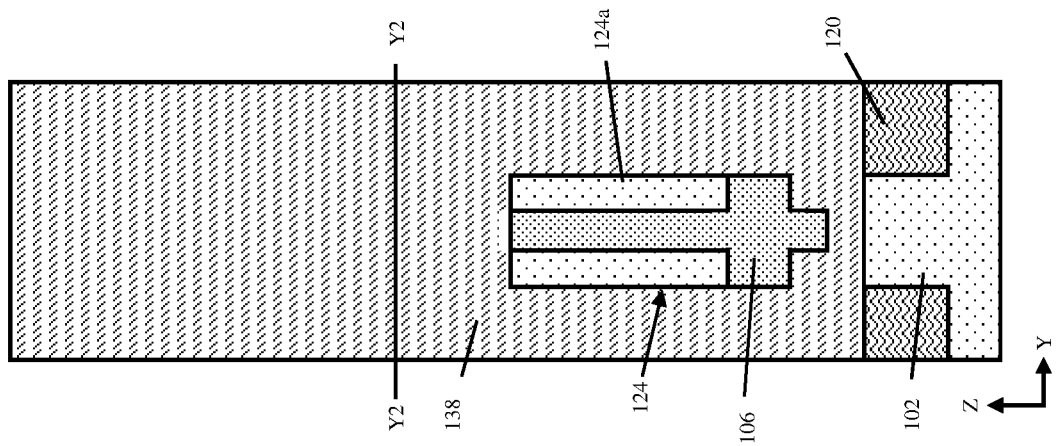
FIGS. 14-16 each show the three cross-sectional views of a step of forming a spacer material according to embodiments of the disclosure.
Figure 15:
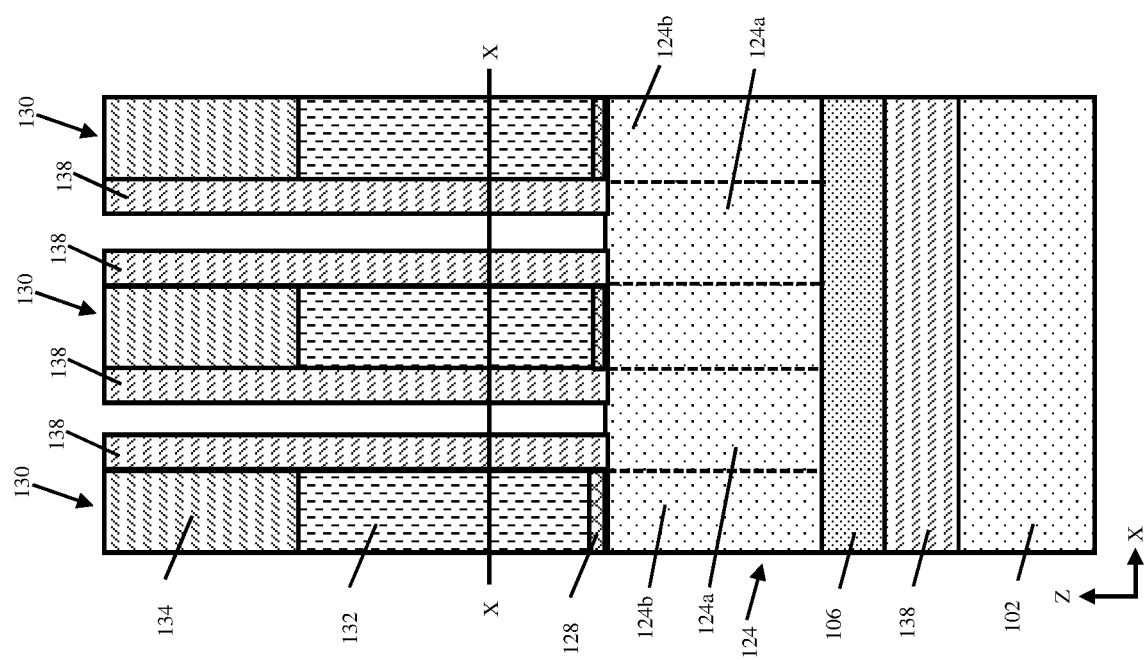

Referring now to FIGS. 14-16, continued processing may include forming a spacer material 138 within spacer opening 136 and horizontally between dummy gate structures 130. Materials appropriate for use as spacer material 138 may include, e.g., silicon nitride, SiBCN, SiNC, SiN, SiCO, and SiNOC, etc., and it is understood that different portions of spacer material 138 may have the same material composition or a different material composition. Spacer material 138 may initially be formed by ALD deposition, followed anisotropic etching of spacer material 138 between dummy gate structure(s) 130. The etching of spacer material 138 between dummy gate structure(s) 130 may cause remaining portions of spacer material 138 to remain intact on the sidewalls of each dummy gate structure 130. It is therefore understood that the prior forming and removing of first sacrificial material 104 may allow spacer material 138 to be formed above and below channel structure(s) 124 as shown in FIGS. 14-16.

Figures 17, 18, 19:
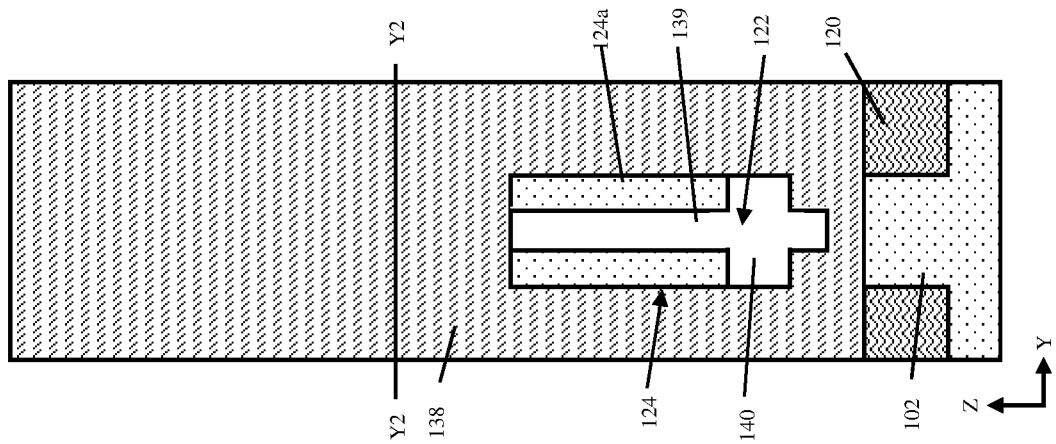
FIGS. 17-19 each show the three cross-sectional views of a step of forming an opening for a spacer support according to embodiments of the disclosure.

Turning to FIGS. 17-19 together, the continued manufacturing of a GAA transistor structure may include etching first portion 124*a* of channel structure 124, and continued etching of second sacrificial material 106. First portion 124*a* of channel structure 124 may be vertically etched by an anisotropic etching process, in which dummy gate structures 130 and spacer material 138 act as self-aligned masks. Continued anisotropic etching beyond channel structure 124 remove an underlying portion of second sacrificial material 106. The anistropic etching may stop at an underlying portion of spacer material 138. A selective etching of second sacrificial material 106 may follow the anisotropic etching of channel structure 124 and sacrificial material. For example, the remaining SiGe may be contacted with a selective etchant such that portions of second sacrificial material beneath channel structures 124 are removed.

The anisotropic etching of channel structures 124 may re-create opening(s) 122, a first portion 139 of which may be between channel structures 124. The subsequent selective etching etching may also form a second portion 140 of opening 122 positioned beneath channel structures 124, e.g., as shown specifically in FIGS. 18 and 19. Together, first and second portions 139, 140 cause opening 122 to be formed alongside and underneath channel structure(s) 124. Opening 122 thus may be identified as a "support region." That is, portions 139, 140 of opening 122 constitute a region of space where support spacers may be formed in subsequent processing as discussed with respect to FIGS. 20-22. The continued presence of dummy gate structure 130 over second portion 124*b* of channel structures 124 and corresponding portions of second sacrificial material 106 may protect second portion 124*b* from being etched.

Referring now to FIGS. 20-22, embodiments of the disclosure may include forming spacer supports 142 within opening 122 (FIGS. 17-19). The forming of spacer supports 142 may be implemented by non-conformal deposition of one or more insulator materials within opening 122, e.g., by ALD. Spacer supports 142 may be composed of one or more currently known or later developed insulating materials capable of being conformally deposited in the form of a film, e.g., one or more nitride insulators. According to one example, spacer supports 142 are formed of silicon nitride (SiN) deposited within opening 122 including the previously formed spacer material 138. In embodiments where spacer supports 142 are made up of SiN, spacer material 138 may be composed of SiBCN as discussed above.

Figure 40:
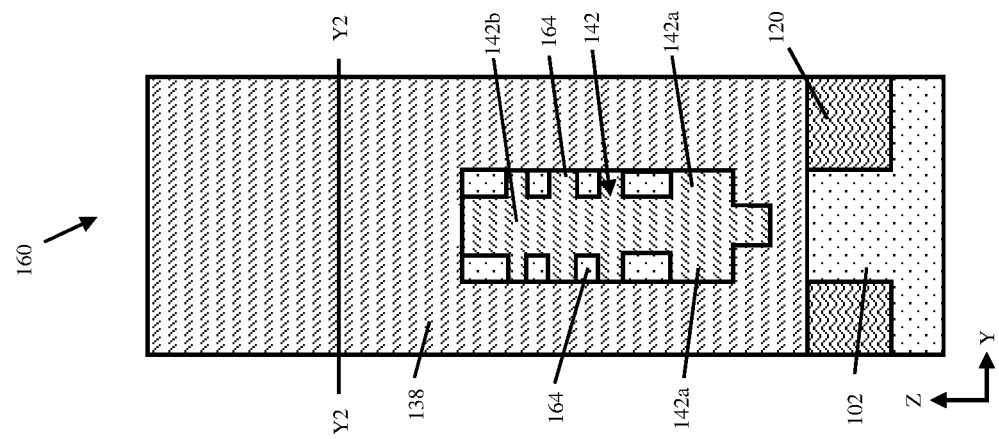
FIGS. 38-40 each show the three cross-sectional views of a GAA transistor with semiconductor nanosheets according to embodiments of the disclosure.
Figure 39:
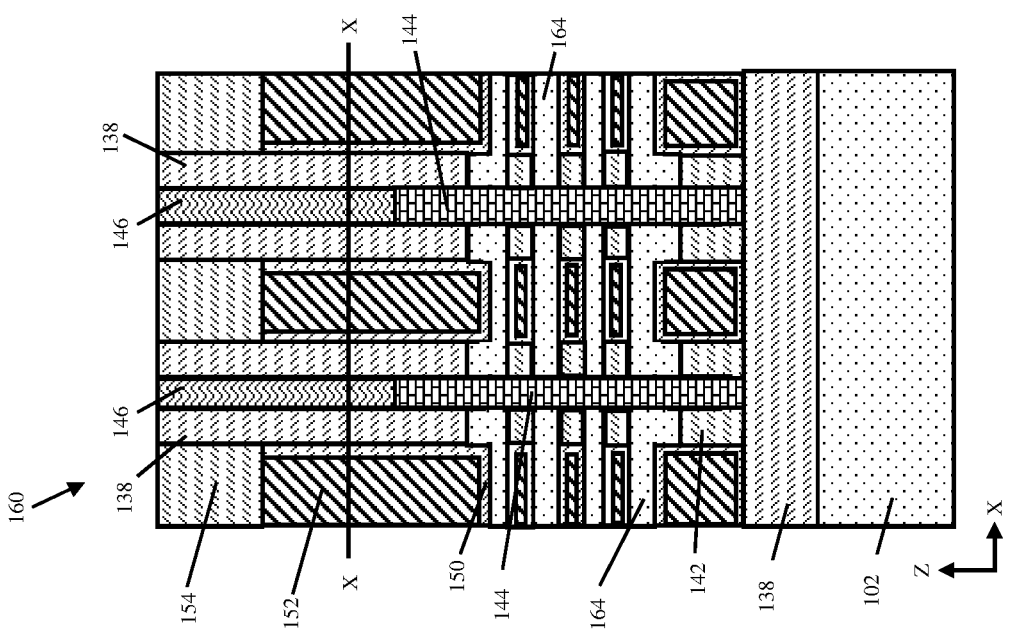
Figure 38:
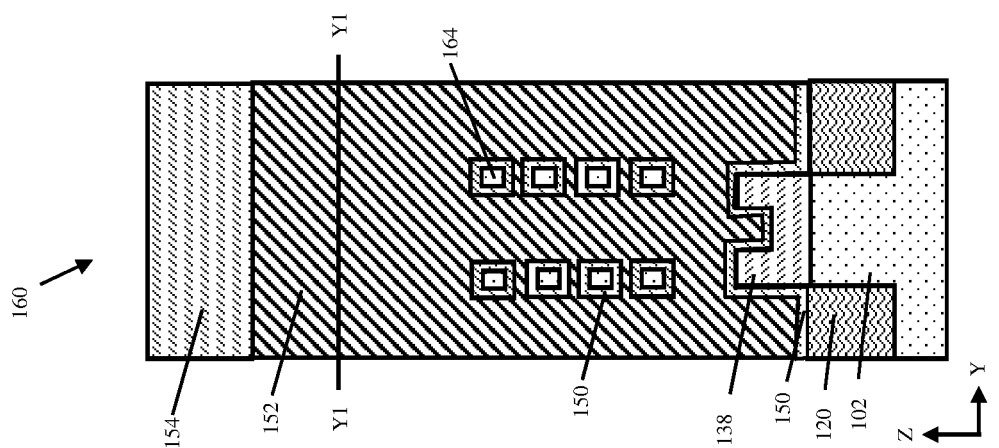

Spacer support(s) 142 may include a first portion 142*a* positioned underneath semiconductor channel structures 124, and a second portion 142*b* positioned alongside semiconductor channel structure(s) 124. Although spacer support 142 is shown to have first and second portions 142*a*, 142*b*, these portions may constitute specific regions of a structurally continuous spacer material deposited to form spacer support(s) 142. In embodiments where channel structures 124 include stacks of nanosheets (e.g., nanosheets 114, 116 (FIG. 2)), spacer support(s) 142 may be formed by selectively etching any remaining sacrificial nanosheets 114. The subsequently deposited spacer material may then be formed within spaces previously occupied by sacrificial nanosheets to "pinch off" space between the remaining nanosheets 116, as is generally provided in the processing of nanosheet transistors. An embodiment of a GAA transistor with nanosheets is shown in FIGS. 38-40 and discussed in further detail below. In any case, spacer supports 142 may be isotropically vertically etched after being formed to reveal the upper surface of spacer material 138 below opening 122. Spacer supports 142 may remain intact beneath other spacer materials 138 and between channel structures 124 as shown specifically in FIG. 22.

Upon being formed, spacer supports 142 may include first portion 142 positioned underneath, and second portion 142b alongside, first portions 124a of channel structure(s) 124 as shown best in FIG. 22. The cross-section of spacer supports 142 in plane Y-Z may resemble two horizontally-oriented and vertically-oriented rectangles which intersect each other. The presence of spacer supports 142 beneath and alongside channel structures 124 may protect and support channel structures 124 during the forming of source or drain terminals and gate metals in subsequent processes. Spacer support (s) 142 thus may include first portion 142a beneath the prior formed spacer material 138, as well as second portion 142b between and underneath channel structures 124.

Figure 23:
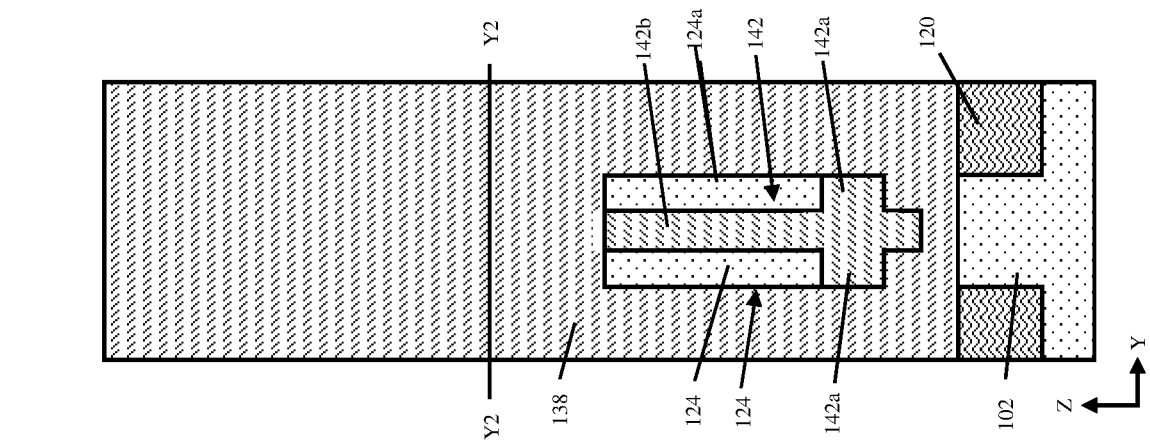
FIGS. 23-25 each show the three cross-sectional views of a step of forming source/drain terminals according to embodiments of the disclosure.
Figure 24:
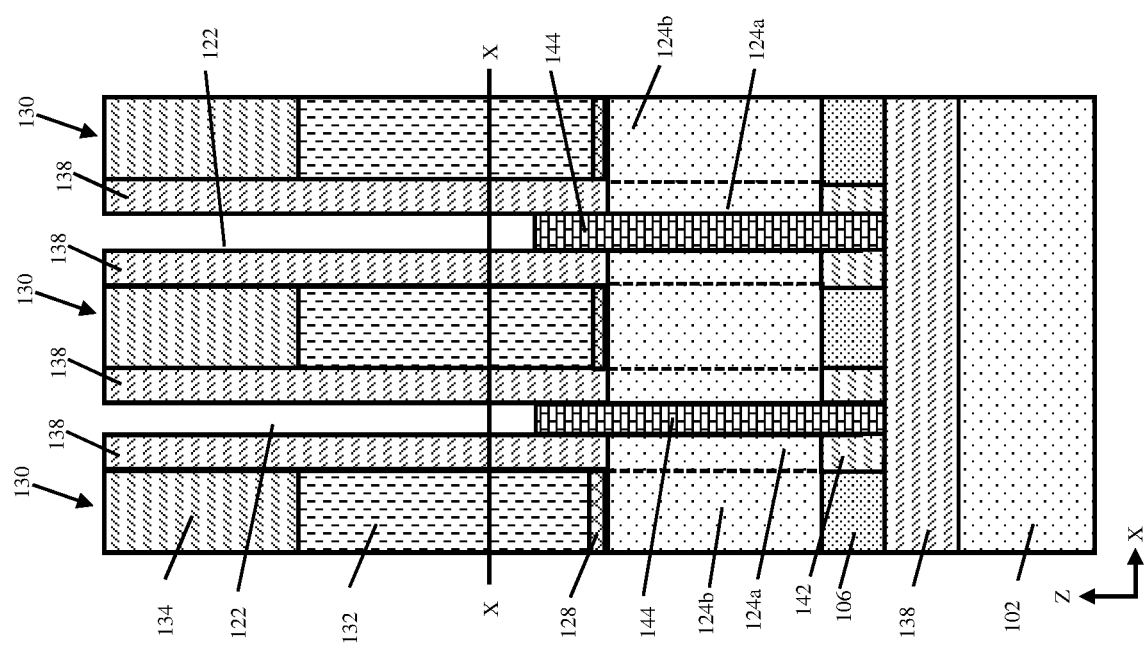
Figure 25:
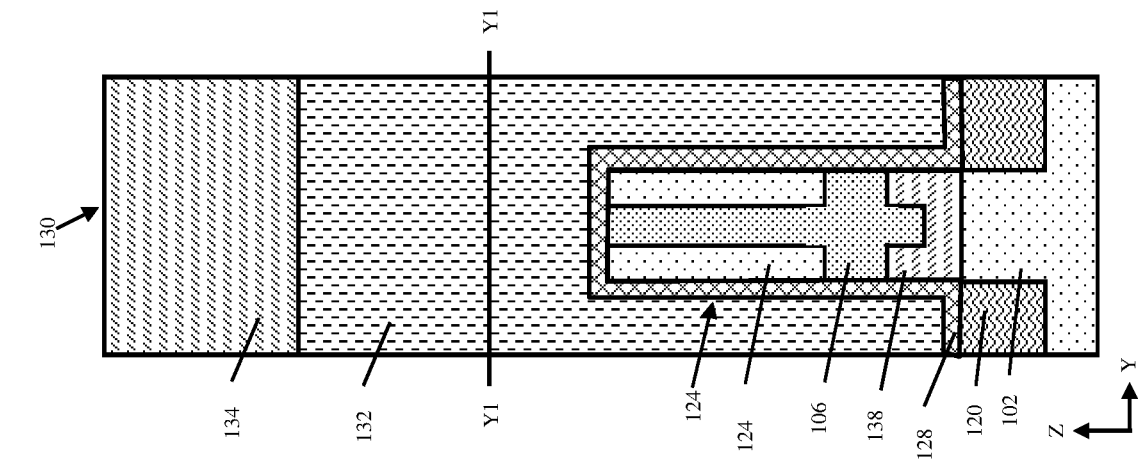

Referring now to FIGS. 23-25, continued manufacture of a GAA transistor may proceed by forming source or drain terminals after spacer supports 142 have been formed. As shown specifically in FIG. 24, a source terminal or drain terminal (simply "source/drain terminals" hereafter) 144 may be epitaxially grown between the ends of channel structures 124, and within the previously formed portions 139, 140 of opening 122. Channel structure 124 thus may be adjacent to a source terminal at one end and a drain terminal at its opposite end. Source/drain terminals 144 may be grown, e.g., from exposed sidewalls of channel structures 124 at first portions 124a thereof. The amount of epitaxial growth may be controlled such that at least part of opening (s) 122, e.g., first portion 139, remain unfilled with source/drain terminals 144 after the epitaxial growth concludes. Source/drain terminals 144 may be positioned in contact with first portions 124a of channel structures 124 to form the transistor structure. Source/drain terminals 144 may also horizontally contact the previously formed spacer support(s) 142. As shown in FIG. 23, portions of second sacrificial material 106, second portions of channel structures 124, and spacer material 138 beneath encapsulation liner 128 and dummy gate structure 130 may remain unaffected while source/drain terminals 144 are formed. Additionally, portions of channel structures 124 and spacer support(s) 142 may also be unaffected while source/drain terminals 144 are being formed as shown in FIG. 25.

Figures 26, 27, 28:
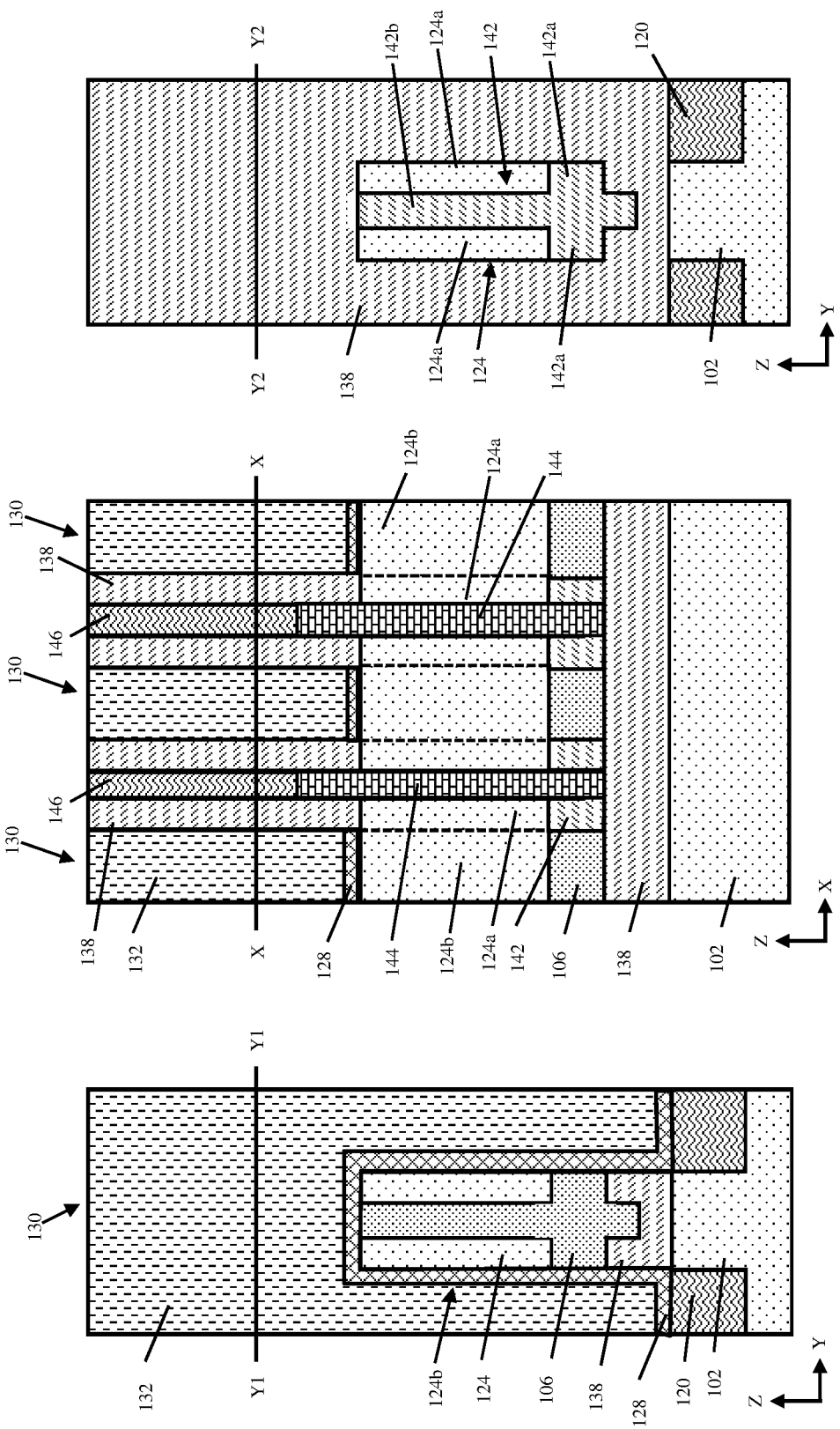
FIGS. 26-28 each show the three cross-sectional views of a step of forming an inter-level dielectric ILD and planarizing the structure according to embodiments of the disclosure.

Turning to FIGS. 26-28, additional materials may be formed to protect source/drain terminals 144 from being affected by the subsequent formation of gate metals at second portion 124b of channel structures 124. For example, the remaining unfilled portions of opening 122 may be filled with an inter-layer dielectric (ILD) 146. ILD 146 may be formed of one or more insulating materials capable of being selectively etched and replaced with conductive metals. According to one example, ILD 146 may be composed of silicon dioxide (SiO$_2$), other oxide insulators, and/or any other currently known or later developed insulator capable of being etched selectively. However embodied, ILD 146 be formed within opening 122 by initially depositing an insulator material within opening 122 (e.g., by CVD or HDP deposition), planarizing ILD 146 (e.g., by CMP) to the height of upper mask 134, and etching and/or planarizing the entire structure until gate semiconductor 132 is exposed.

Referring now to FIGS. 29-31, dummy gate structures 130 (FIGS. 7-28) and remaining portions of second sacrificial material 106 (FIGS. 7-28), encapsulation liner 128 (FIGS. 7-28), may be removed to prepare second portion 124b of channel structure(s) 124 for the forming of gate metals. The removing of sacrificial material 106, encapsulation liner 128, and remaining portions of second sacrificial material 106 may be implemented with one or more etchants selective to semiconductor materials and/or the material composition of encapsulation liner 128 without affecting spacer material 138, spacer support(s) 142, and/or ILD 146. The removing by selective etching may reveal an exterior surface area of channel structures 124 at second portion(s) 124b, and as shown specifically in FIGS. 29 and 30. In the case of nanosheet transistor architectures, any remaining sacrificial nanosheets may be removed during the same etch. Thus, the outer circumference of each semiconductor nanosheet within channel structure(s) 124 may become exposed after the etching. First portion(s) 124a of channel structures 124 may remain structurally supported by spacer material(s) 138, spacer support(s) 142, and source/drain terminals 144 as shown specifically in FIGS. 30 and 31.

Turning to FIGS. 32-34, continued manufacturing to form a GAA transistor may include thinning (i.e., reducing the cross-sectional area) of channel structures 124 at second portion(s) 124b. Thinning of channel structures 124 may decrease electrical resistance at the gate terminal of a GAA transistor and/or improve physical and electrical separation between individual channel regions. The prior forming of spacer support(s) 142 may reduce the risk of structural defects in channel structures 124 during the thinning of channel structures 124. Processes for thinning of channel structures 124 may include, e.g., a controlled selective etching of semiconductor materials to yield a desired size and cross-sectional area. The thinning of channel structures 124 may alternatively be integrated with and/or performed concurrently with earlier processes for removing dummy gate structures 130 and/or other materials at second portion 124b of channel structures 124. The presence of spacer material 138, spacer supports 142, and/or source/drain terminals 144 at second portion 124b may prevent the thinning of second portion(s) 124b. After the thinning of channel structures 124, the cross-sectional area of first portion 124a of channel structure 124 may be greater than the cross-sectional area of second portion 124b.

Figure 37:
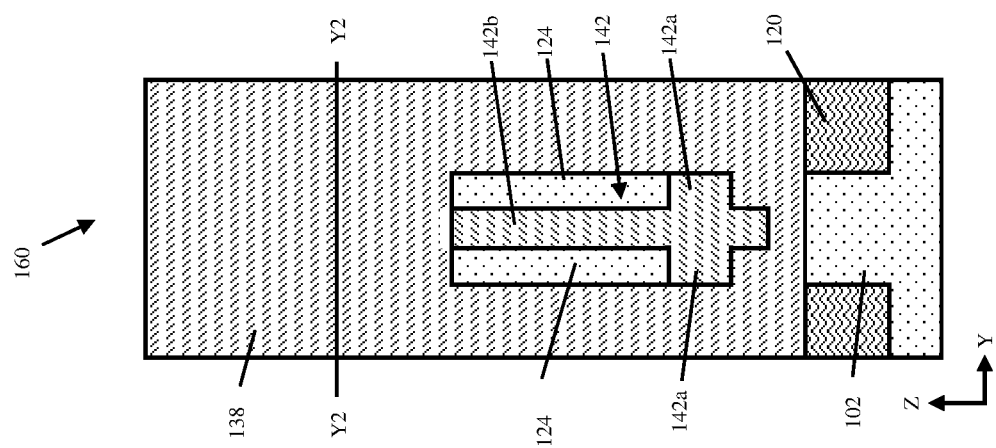
FIGS. 35-37 each show the three cross-sectional views of a step of forming a gate metal to create a gate-all-around (GAA) transistor according to embodiments of the disclosure.
Figure 36:
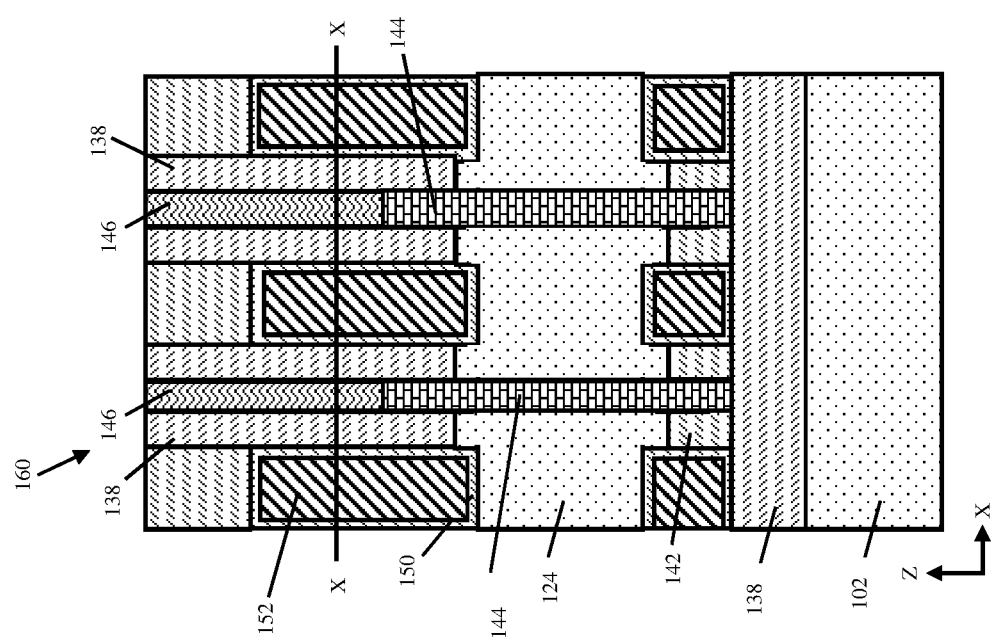
Figure 35:
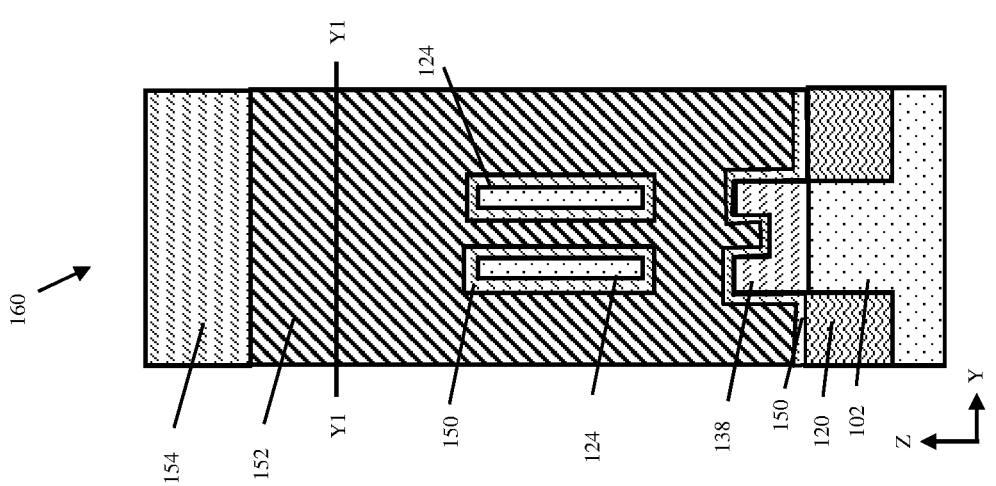

Turning now to FIGS. 35-37, the components of a gate terminal for a GAA transistor may be formed on second portion 124b of channel structure 124. Before depositing metallic portions of a gate, a set of gate dielectric layers 150 may be conformally deposited (e.g., by ALD) on second portion 124b of channel structure 124. Gate dielectric layer 150 may take the form of a thin silicon dioxide (SiO$_2$) layer or other gate dielectric material configured for placement between a semiconductor channel and a gate metal. Gate dielectric layer 150 may additionally be formed conformally on STI(s) 120, spacer material 138, etc., as a result of the conformal deposition on exposed surfaces. After gate dielectric layer 150 is formed, continued manufacture of the structure may include forming a gate metal 152 on second portion 124b of channel structure 124. Gate metal 152 be conformally deposited to surround channel structure 124, and in contact with the outer perimeter of gate dielectric layer 150. Gate metal 152 may include, e.g., any combination of conducting materials (e.g., metal, doped semiconductor materials, etc.) for providing an electrostatic gate dielectric layer 150. As further examples, gate metal 152 can be in the form of any currently known or later developed conductive material such as, e.g., aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), tungsten (W), tungsten nitride (WN), tungsten carbide (WC), polycrystalline silicon (poly-Si), and/or combinations thereof. At the time of being formed, spacer support(s) 142 may be positioned directly horizontally between source/drain terminals 144 and gate metal 152.

After gate metal 152 is formed, Self-aligned contact cap (SAC cap) 154 may be formed to encapsulate the gate metal such that later self-aligned contact etch can be performed. SAC cap 154 may take be composed of any currently known or later developed insulating material configured to electrically separate different levels of a device structure. According to an example, SAC cap 154 may include one or more of the various insulator materials described above relative to other insulating materials. SAC cap 154 may then be planarized by way of chemical mechanical polishing (CMP) or a similar process such that the top surface of SAC cap 154 is substantially coplanar with an upper surface of spacer material 138 and ILD 146.

FIGS. 35-37 provide cross-sectional views of a GAA transistor 160 according to embodiments. As discussed above, GAA transistor 160 may include source/drain terminals 144 with channel structures 124 extending horizontally between source/drain terminals 144. Spacer support 142 may continue to include first portion 142a underneath, and second portion 142b alongside, first portion 124a of channel structures 124. Gate dielectric layer(s) 150 and gate metal 152 of GAA transistor 160 may surround second portion 124b of channel structures 124b between the pair of source/drain terminals 144. In this configuration, spacer support(s) 142 are positioned between one source/drain terminal 144 and gate metal 152. To electrically connect GAA transistor 160 to other circuit components, openings may be formed (e.g., by etching) within SAC cap 154, and/or ILD 146 (FIGS. 24, 27, 30, 33, 36) may be selectively removed, to expose underlying portions of source/drain terminals 144 and gate metal 152. In such cases, a refractory metal liner (not shown) may then be formed on sidewalls of the openings, followed by filling the openings with conductive metals (not shown) for electrically coupling GAA 160 to other device layers.

FIGS. 38-40 depict an alternative cross-sectional views of GAA transistor 160 which use nanosheet semiconductor materials instead of fin-type semiconductor regions. According to an embodiment, channel structures 124 may take the form of nanosheet channel structures 164. Although four nanosheet channel structures 164 are shown for example in FIGS. 38-40, it is understood that any desired number of nanosheets (e.g., ten nanosheets, one-hundred nanosheets, five-hundred or more nanosheets, etc.) may be included one GAA transistor 160. GAA transistor 160 with nanosheet channel structures 164 may be performed in accordance with the various process steps discussed above, but with nanosheet stacks being used in place of the original semiconductor channel material. As discussed specifically with regard to FIGS. 20-22, sacrificial nanosheets in the original stack may be removed by selective etch, such that portions of spacer support(s) 142 fill the open space between nanosheet channel structures 164 when being deposited. In GAA transistor 160, nanosheet channel structures 164 may also alternate with stacks of gate dielectric layer 150 and gate metal 152 at the gate region of GAA transistor 160.

Advantages of using nanosheet channel structure 164 in GAA transistor 160 as compared to semiconductor fins may include, e.g., additional contact area between gate metal 152 and semiconductor materials in channel structures 124. In this configuration, spacer support(s) 142 may exhibit a "fishbone" type structure in which portions of spacer support 142 extend at least partially horizontally between nanosheet channel structures 164. However, the remaining portions of GAA transistor 160 including source/drain terminals 144, and gate metal(s) 152 may be unchanged from other embodiments of GAA transistor 160 (shown, e.g., in FIGS. 38-40). The various manufacturing steps to form GAA transistor 160 may be substantially unchanged, apart from the initial procedures to form nanosheet channel structures 164, as compared to embodiments with semiconductor fins therein.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. For example, while the present disclosure describes a process related to nanosheet devices, it is anticipated that a similar process may be applied to vertically-oriented devices and/or other transistor architectures. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A gate-all-around (GAA) transistor, comprising:
   at least one semiconductor channel structure extending between a source terminal and a drain terminal;
   a spacer support having a first portion thereof contacting and positioned underneath and a second portion thereof contacting and positioned alongside a first portion of the at least one semiconductor channel structure, wherein the spacer support is free of contact with an uppermost surface of the semiconductor channel structure, and with a sidewall of the semiconductor channel structure opposing the sidewall in contact with the second portion of the spacer support;
   a gate metal surrounding a second portion of the at least one semiconductor channel structure between the source and drain terminals; and
   a spacer material having a different material composition from the spacer support, and positioned on a semiconductor substrate and beneath each of the spacer support and the gate metal,
   wherein the spacer support is positioned between the gate metal and the source or drain terminal and the spacer material contacts the upper surface of the semiconductor channel structure and the sidewall of the semiconductor channel structure opposite the spacer support.

2. The GAA transistor of claim 1, wherein the spacer material comprises silicoboron carbonitride (SiBCN), and wherein the spacer support comprises silicon nitride (SiN).

3. The GAA transistor of claim 1, wherein a cross-sectional area of the first portion of the at least one semiconductor channel structure is greater than a cross-sectional area of the second portion of the at least one semiconductor channel structure.

4. The GAA transistor of claim 1, wherein a height of the first portion of the at least one semiconductor channel structure is at least approximately seventy nanometers (nm).

5. The GAA transistor of claim 1, wherein a width of the spacer support between the pair of semiconductor channel structures is at most approximately twelve nanometers (nm).

6. The GAA transistor of claim 1, wherein the at least one semiconductor channel structure comprises a plurality of semiconductor nanosheets, and wherein the spacer support is positioned underneath and alongside each of the plurality of semiconductor nanosheets.

7. A gate-all-around (GAA) transistor, comprising:
a pair of semiconductor channel structures each extending between a source terminal and a drain terminal;
a spacer support having a first portion thereof contacting and positioned underneath each of the pair of semiconductor channel structures and a second portion thereof positioned alongside and having opposing sidewalls each contacting a first portion of a respective one of the pair of semiconductor channel structures, wherein the spacer support is free of contact with an upper surface of each of the pair of semiconductor channel structures, and with a sidewall of each of the pair of semiconductor channel structures opposing the sidewall in contact with the second portion of the spacer support;
a gate metal surrounding a second portion of each of the pair of semiconductor channel structures between the source and drain terminals; and
a spacer material having a different material composition from the spacer support, and positioned on a semiconductor substrate and beneath each of the spacer support and the gate metal,
wherein the spacer support is positioned between the gate metal and the source or drain terminal and the spacer material contacts the upper surface of the semiconductor channel structure and the sidewall of the semiconductor channel structure opposite the spacer support.

8. The GAA transistor of claim 7, wherein the spacer material comprises silicoboron carbonitride (SiBCN), and wherein the spacer support comprises silicon nitride (SiN).

9. The GAA transistor of claim 7, wherein a cross-sectional area of the first portion of each of the pair of semiconductor channel structures is greater than a cross-sectional area of the second portion of the pair of semiconductor channel structures.

10. The GAA transistor of claim 7, wherein a width of the spacer support between the pair of semiconductor channel structures is at most approximately twelve nanometers (nm).

11. A gate-all-around (GAA) transistor, comprising:
a pair of semiconductor channel structures each having a plurality of semiconductor nanosheets extending between a source terminal and a drain terminal;
a spacer support having a first portion thereof contacting and positioned underneath each of the pair of semiconductor channel structures and a second portion thereof positioned alongside and having opposing sidewalls each contacting a first portion of a respective one of the pair of semiconductor channel structures, wherein each of the plurality of semiconductor nanosheets of the pair of semiconductor channel structures includes at least one sidewall free of contact with the spacer support; and
a gate metal surrounding a second portion of each of the pair of semiconductor channel structures between the source and drain terminals; and
a spacer material having a different material composition from the spacer support, and positioned on a semiconductor substrate and beneath each of the spacer support and the gate metal,
wherein the spacer support is positioned between the gate metal and the source or drain terminal and the spacer material contacts the uppermost surface of the semiconductor channel structure and the sidewall of the semiconductor channel structure opposite the spacer support.

12. The GAA transistor of claim 11, wherein the spacer material comprises silicoboron carbonitride (SiBCN), and wherein the spacer support comprises silicon nitride (SiN).

13. The GAA transistor of claim 11, wherein a height of the first portion of the pair of semiconductor channel structures is at least approximately seventy nanometers (nm).

14. The GAA transistor of claim 11, wherein a width of the spacer support between the pair of semiconductor channel structures is at most approximately twelve nanometers (nm).

* * * * *